(12) United States Patent
Faulkner et al.

(10) Patent No.: US 7,816,240 B2
(45) Date of Patent: Oct. 19, 2010

(54) METHOD FOR MAKING SEMICONDUCTOR INSULATED-GATE FIELD-EFFECT TRANSISTOR HAVING MULTILAYER DEPOSITED METAL SOURCE(S) AND/OR DRAIN(S)

(75) Inventors: Carl M. Faulkner, Little Rock, AR (US); Daniel J. Connelly, San Francisco, CA (US); Paul A. Clifton, Mountain View, CA (US); Daniel E. Grupp, Palo Alto, CA (US)

(73) Assignee: Acorn Technologies, Inc., Santa Monica, CA (US)

( * ) Notice: Subject to any disclaimer, the term of this patent is extended or adjusted under 35 U.S.C. 154(b) by 94 days.

(21) Appl. No.: 11/678,397

(22) Filed: Feb. 23, 2007

(65) Prior Publication Data

US 2007/0224739 A1    Sep. 27, 2007

Related U.S. Application Data

(60) Provisional application No. 60/776,571, filed on Feb. 23, 2006.

(51) Int. Cl.
*H01L 21/28* (2006.01)
(52) U.S. Cl. ............... 438/573; 438/586; 257/E21.425; 257/E29.311; 257/E29.148; 257/E29.271; 257/E21.047; 257/E21.163; 257/E21.173
(58) Field of Classification Search ................. 438/586, 438/573; 257/E21.425, E29.178, E29.311, 257/E29.148, E29.271, E31.051, E31.066, 257/E21.374, E21.047, E21.163, E21.173, 257/73
See application file for complete search history.

(56) References Cited

U.S. PATENT DOCUMENTS

| 3,725,743 | A  | * | 4/1973 | Murayama | 174/264 |
|---|---|---|---|---|---|
| 7,074,684 | B2 | * | 7/2006 | Roy et al. | 438/300 |
| 7,247,913 | B2 | * | 7/2007 | Yagishita | 257/368 |
| 7,294,924 | B2 | * | 11/2007 | Kim | 257/707 |
| 2003/0045039 | A1 | * | 3/2003 | Shin et al. | 438/197 |
| 2003/0165615 | A1 | * | 9/2003 | Aaltonen et al. | 427/79 |
| 2003/0218221 | A1 | * | 11/2003 | Wager et al. | 257/410 |
| 2004/0026687 | A1 |   | 2/2004 | Grupp et al. | |
| 2004/0142524 | A1 | * | 7/2004 | Grupp et al. | 438/197 |
| 2005/0095852 | A1 | * | 5/2005 | Saenger et al. | 438/672 |
| 2005/0098831 | A1 |   | 5/2005 | Lee et al. | |
| 2005/0275033 | A1 | * | 12/2005 | Zhu et al. | 257/368 |

(Continued)

FOREIGN PATENT DOCUMENTS

EP    1 548 838 A    6/2005

(Continued)

OTHER PUBLICATIONS

S. J. Wind, Carbon Nanotube Devices for Future Nanoelectronics, 2003, IEEE, pp. 236-236.*

(Continued)

*Primary Examiner*—N Drew Richards
*Assistant Examiner*—Yu-Hsi Sun
(74) *Attorney, Agent, or Firm*—Sonnenschein Nath & Rosenthal LLP

(57) ABSTRACT

A metal source/drain field effect transistor is fabricated such that the source/drain regions are deposited, multilayer structures, with at least a second metal deposited on exposed surfaces of a first metal.

2 Claims, 5 Drawing Sheets

U.S. PATENT DOCUMENTS

2007/0194331 A1 * 8/2007 Yeh et al. .................. 257/88

FOREIGN PATENT DOCUMENTS

| JP | 07 066404 A | | 3/1995 |
| JP | 2005026563 A | * | 1/2005 |
| WO | 2004/015782 A | | 2/2004 |
| WO | WO 2005093794 A1 | * | 10/2005 |

OTHER PUBLICATIONS

Acorn Technologies, Inc., International Search Report and Written Opinion, PCT/US2007/062742, ISA/EP, Jul. 26, 2007, European Patent Office, 11pp.

* cited by examiner

METHOD FOR MAKING SEMICONDUCTOR INSULATED-GATE FIELD-EFFECT TRANSISTOR HAVING MULTILAYER DEPOSITED METAL SOURCE(S) AND/OR DRAIN(S)

RELATED APPLICATIONS

This application is a nonprovisional of, claims priority to and incorporates by reference U.S. Provisional Patent Application 60/776,571, filed 23 Feb. 2006.

FIELD OF THE INVENTION

The present invention relates to methods for making semiconductor-based field effect transistors (FETs) having multilayer, deposited, metal source(s)/drain(s), and in particular, such FETs as include a relatively thin deposited metal as a source/drain, capped with a second deposited metal.

BACKGROUND

Metal Oxide Semiconductor Field-Effect Transistors (MOSFETs), also known as Insulated Gate Field-Effect Transistors (IGFETs), are semiconductor devices in which carriers (electrons and/or holes) are provided by one or more source(s), traverse one or more channel(s), and are collected by one or more drain(s). Resistance of the channel(s) is then controlled by one or more gate(s). For high performance, the resistance associated with the electrical path between source(s) and drain(s) should be low when the transistor channel(s) are "on", and high when the transistor is "off". Source(s) and/or drain(s) are typically formed of relatively highly conducting regions to minimize the electrical resistance of the device when channel(s) are on.

A key to a low resistance between source(s) and drain(s) is that the resistance between source(s) and channel(s) be low when the channel(s) are on. This requires a sufficiently unimpeded current path between the highly conducting source(s) and the channel(s). The resistance between drain(s) and channel(s) can also be important. Among the ways in which the current path between a source (or drain) and a channel can be impeded is a potential barrier between the source (or drain) and the channel. Exemplary band diagrams from a metal source, through a silicon channel, and into a metal drain are shown in FIGS. 1(a) and 1(b).

In particular, FIG. 1(a) illustrates an example with a zero potential barrier between a source 10 and a channel 12 and between a drain 14 and the channel 12. Carriers flow efficiently from the source into the channel, from which they are subsequently collected by the drain. FIG. 1(b) illustrates an example of a potential barrier between a source 10' (and drain 14') and a channel 12'. Carriers must be emitted over, or tunnel through, the potential barrier at the source side to reach the channel from the source. This reduces the available device current relative to the case of a zero potential barrier.

One class of field-effect transistors is "metal source/drain" transistors. In these devices, the source(s) and drain(s) consist of metals, rather than the impurity-rich semiconductors commonly employed in the art. The advantage of metal source/drain FETs, over FETs with sources and drains consisting of impurity-doped semiconductor(s), is that metals generally have higher conductivity than do impurity-doped semiconductors, allowing for the possibility of a lower resistance transistor. An additional advantage is that metal source(s) and drain(s) can be made to be atomically abrupt, whereas impurity profiles in semiconductors tend to have more gradual transitions between impurity-rich and impurity-poor regions, or between regions rich in donor impurities and regions rich in acceptor impurities. Derivatives of metal source/drain transistors include metal source transistors, in which source(s) but possibly not drain(s) are metal, and metal drain transistors, in which drain(s) but possibly not source(s), are metal.

In such devices, a critical parameter is the effective workfunction of the metal at its interface with the semiconductor(s) forming the region of the channel(s). For example, for an n-channel FET, in which the channel is formed primarily of electrons in the semiconductor, a low effective workfunction associated with this interface may be preferred, to minimize or eliminate a potential barrier from the metal to the channel. Alternatively, for a p-channel FET, in which the channel is formed primarily of holes in the semiconductor, a high effective workfunction associated with this interface may be preferred, to minimize or eliminate a potential barrier from the metal to the channel.

One approach to forming metal sources and/or drains is via reacting a metal with one or more semiconductors in the vicinity of the source and/or drain regions to form metal-semiconductor compounds. For example, with Si-based transistors (Si making up the material in which the channel is formed), metal silicides are used. See, for example U.S. Pat. No. 6,744,103 of Snyder, "*Short-channel Schottky-Barrier MOSFET Device and Manufacturing Method*".

P-channel and n-channel transistors can be fabricated in the same process with the use of two silicides, one with a relatively low workfunction for n-channel transistors, and the other with a relatively high workfunction for p-channel transistors. For example, Kedzierski et al., "*Complementary silicide source/drain thin-body MOSFETs for 20 nm gate length regime*", 2000 IEEE IEDM Technical Digest, pp. 57-60, use $ErSi_{1.7}$ as the low-workfunction silicide, and PtSi as the high-workfunction silicide. The process described is, in part: (a) deposit Pt, (b) pattern the Pt, (c) apply heat to cause PtSi to be formed, (d) remove the unreacted Pt, (e) deposit Er, (f) pattern the Er, (g) apply heat to form $ErSi_{1.7}$, (h) remove the unreacted Er.

Another example is provided by X. Tang, et al., "*Very low Schottky barrier to n-type silicon with PtEr-stack silicide*", Solid-State Electronics, v. 47, pp 2105-2111 (2003). They describe a process in which 50 nm of Er is capped with 40 nm of Pt, and then exposed to heat to form $ErSi_{1.7}$, while the Pt remains unreacted. The motivation for the process is to use the Pt for the formation of PtSi on, for example, p-channel FETs, while $ErSi_{1.7}$ is formed on, for example, n-channel FETs. Further, it is claimed the quality of the $ErSi_{1.7}$ is improved by capping the Er during the silicidation reaction. A full process is not described, nor were transistors fabricated, and so whether the unreacted Pt remains in place at the completion of the process is not disclosed. No motivation was presented by the authors for doing so, and doing so would be contrary to the present art. Therefore, there is no indication the work was a preparation for a multi-layer source/drain, and certainly the work was not a preparation for a deposited source/drain consistent with the use of the term "deposited source/drain" in the context of the present invention.

It has also been established (see S. Park, et al., "*Ab initio study of metal gate electrode work function*," J. Appl. Phys, vol. 86, p. 073118 (2005)), that the effective workfunction of metals at interfaces is dominated by the metal within the first few atomic layers of the interface. Therefore, for metal source(s) and/or metal drain(s), more than one metal may be present, but the metal within a few atomic layers of the interface is the one which primarily determines the existence and/or extent of a potential barrier between the source(s) and/or drain(s) and channel(s) with which they are in contact.

SUMMARY OF THE INVENTION

In one embodiment of the invention, following exposure of a semiconductor surface for a source and/or drain of a field effect transistor (FET), a first layer of a first metal is deposited to form a first metal layer of said source and/or drain, and a second layer of a second metal is deposited to form a second metal layer over said first metal layer. Each of these deposition processes may include depositing of one or more layers that do not themselves inhibit flow of current between adjacent layers in the source and/or drain.

In some embodiments, the second metal exhibits superior chemical stability with one or more materials with which it will be in contact, relative to chemical stability of the first metal with the one or more materials, and an area of contact between the second metal and the one or more materials is greater than an area of contact between the first metal and the one or more materials. Moreover, the second metal may possess a lower electrical resistivity and/or lower thermal resistivity than the first metal.

In some cases, the first metal layer, at a time of deposition of the second metal layer, has a thickness of no more than approximately 100 nm; of no more than approximately 10 nm; or may be deposited with a thickness of no less than 3 atomic layers, or 1 nm, whichever is thinner.

A semiconductor forming a region of a channel in a vicinity of the source and/or drain may consist primarily of Si, Ge, an alloy of Si and Ge, an alloy of Si and C, an alloy of Ge and C, an alloy of Si, Ge, and C, an alloy or compound of column III and column V elements on the periodic table, an alloy or compound of column II and column VI elements on the periodic table, an alloy or compound of column II, III, IV, V, and/or column VI elements on the periodic table, or a molecular semiconductor, primarily of carbon.

The first and/or second metal may be primarily one or more of Mg, Rb, Cs, La, Ce, Pr, Nd, Pm, Sm, Eu, Gd, Tb, Dy, Ho, Er, Tm, Yb, Lu, Rb or Cs; or an alloy or compound of one or more thereof, or a hexaboride or an alloy of one or more hexaborides thereof.

In a further embodiment of the invention, a semiconductor-based field-effect transistor, is formed such that subsequent to exposure of a semiconductor surface for a source and/or drain, a first metal layer is deposited; a second metal layer is deposited in contact with the first metal layer prior to any deposition or formation of additional non-metallic layers; and a third metal layer is deposited in contact with the second metal layer prior to any deposition or formation of additional non-metallic layers.

BRIEF DESCRIPTION OF THE DRAWINGS

The present invention is illustrated by way of example, and not limitation, in the figures of the accompanying drawings, in which:

FIG. 3(a) shows a single metal source/drain device. FIG. 3(b) shows a capped metal source/drain device in which the source and drain are each formed of an interfacial metal and are capped with a second metal. FIG. 3(c) shows another embodiment of a capped metal source/drain device, in this case where the interfacial metal was selectively deposited on the semiconductor forming the body and not elsewhere. FIG. 3(d) illustrates yet another capped metal source/drain device, in which the interfacial metal was deposited, then removed from regions not protected by the overlap of the insulator. FIG. 3(e) illustrates an example of a device in which three metals are used for each source and drain; the first interfacial metal forming the source and drain proper, capped with a second metal, all capped with a third metal. FIG. 3(f) illustrates an example of a device in which the source metal and drain metal differ.

FIG. 4(a) illustrates an example wherein n-channel FET has a source and a drain of one metal type, and the p-channel FET has a source and a drain of an alternate metal. FIG. 4(b) illustrates an example where the n-FET, but not the p-FET, possesses a multilayer metal source and drain.

DETAILED DESCRIPTION

Figure 1A:
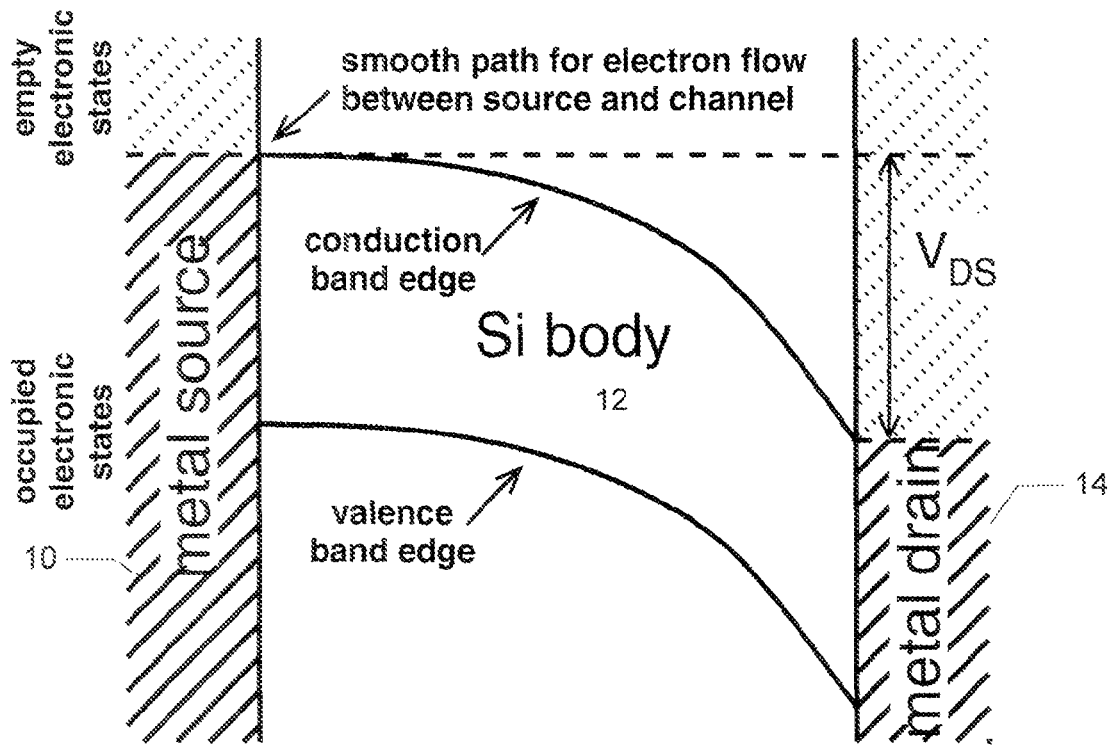
FIGS. 1(a) and 1(b) present examples of band diagrams from a metal source, through a silicon channel, and into a metal drain.
Figure 1B:
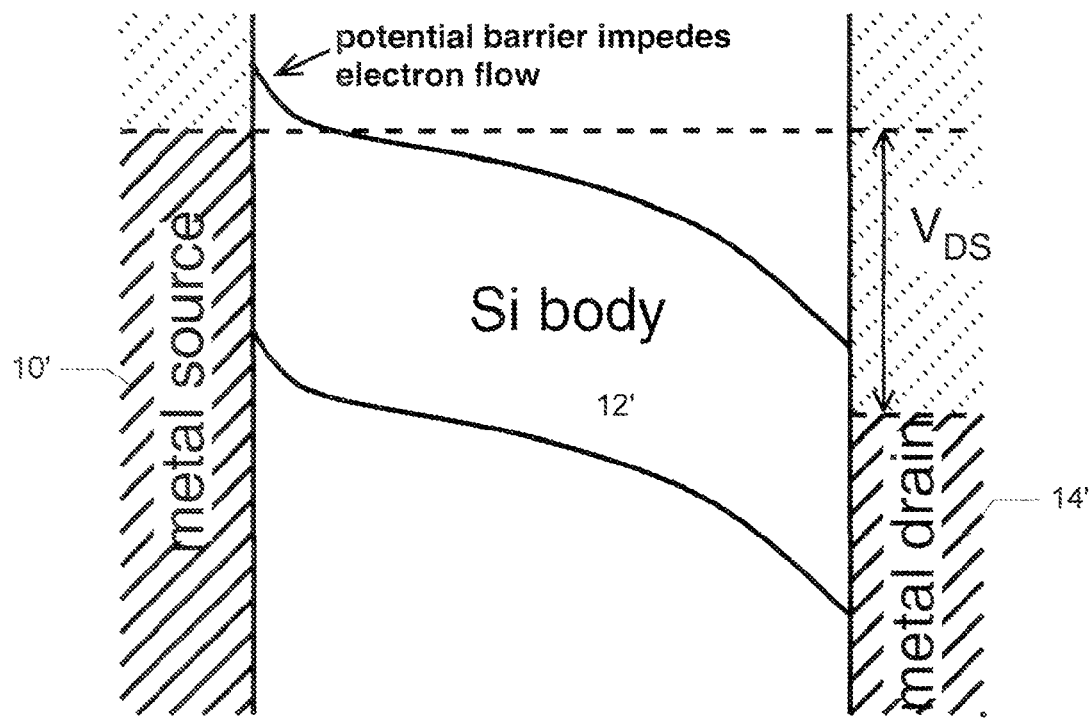

The present invention relates to with devices in which one or more source(s), and/or one or more drain(s), of an insulated-gate field-effect transistor are metal.

As indicated above, one approach to forming metal sources and/or drains is the use of metal silicides. The issue with silicides is that the range of available metals is more restrictive than with the broader class of metals that may be deposited. Additionally, it may be preferable to deposit source and/or drain metals, instead of forming them via a reaction such as silicidation, in order to use one or more passivation layer(s) between the metal and the semiconductor. For example, passivation layer(s) may reduce the interactions between the metal and the semiconductor(s) in the channel region, interactions that lead to the formation of charge at the interface that tends how small a Schottky barrier can be achieved. See Grupp, et al., "*Insulated Gate Field-Effect Transistor Having Passivated Schottky Barriers at the Channel*", USPGPub 2004/0026736. Alternatively, is may be preferable to deposit metals, instead of forming them by chemical reaction, to improve the precision of the metal placement, especially including the location and orientation of the metal/semiconductor interface.

One motivation for the use of multiple metals with deposited source(s) and/or drain(s) is chemical stability. For n-channel FETs, to reduce the potential barrier between source(s) and/or drain(s) and channel(s) to which they are in contact, a low effective workfunction interface is preferred, for which metal(s) with low workfunctions are candidates. Note that the effective workfunction of the interface, and the characteristic workfunction of a material at the interface, may differ due to material interactions. Low-workfunction metals, such as the rare earth materials, tend to have a relatively low chemical stability, and thus they tend to react with adjacent materials (including gases), especially when heated. It thus may be preferred to cap these low-workfunction metal(s) with one or more other metals, such that the cap metal(s) protect the low-workfunction metal(s) from reactions associated with subsequent processing and/or subsequent environmental exposure. For example, the first metal may be susceptible to oxidation. In such a case, it may be advantageous to deposit the first metal in a relative vacuum (low oxygen partial pressure), then deposit the second metal prior to exposure to a substantial partial pressure of oxygen.

Another example of multi-level metals to promote chemical stability is the use of a metal of superior chemical stability to "bind" a near-monolayer film of reduced stability. See, e.g., Zworykin and Wilson, "*The Cesium-Magnesium Photocell*", Journal of the Optical Society of America, v. 19, pp. 81-89 (August 1929). There, the authors used an ultra-thin cesium layer capped with magnesium to stabilize the Cs, which in bulk form melts at 28° C., to at least 150° C. A similar approach can be applied to a deposited source/drain, exploiting the low Cs workfunction.

Another possible motivation for multiple metal layers is electrical resistance. If the metal of the desired workfunction for the interface has a higher resistivity than another metal available in the process, the use of a thin layer of the low-workfunction (or high-workfunction) metal at the interface, capped with a second metal of lower resistivity, will reduce the net resistance associated with connections between the metal source(s) and/or drain(s) and external circuit(s).

Another possible motivation for multiple metal layers is thermal resistance. Thermal resistance is an important feature of semiconductor devices, as the dissipation of electrical power within the device, in the presence of high thermal resistance, may result in temperatures sufficiently elevated to compromise the device performance and/or device reliability. The metal chosen for the interface may have a greater thermal resistivity than other metal(s) available in the process, in which case a thin metal at the interface, capped with a metal of lower thermal resistivity, will have reduced net thermal resistance relative to the same net dimension of metal consisting completely of the interface metal.

Another possible motivation for multiple metal layers is the co-integration of multiple device types. For example, the preferred metal for n-channel FETs may be a low workfunction metal such as $LaB_6$, while the preferred metal for a p-channel FET may be a high-workfunction metal such as Ir. Complementary processes are those in which both n-channel and p-channel FETs are fabricated on the same substrate, and therefore, to optimize each device type, two or more types of metal may be needed. In this example, Ir could be deposited in the source and drain region(s) (in possible conjunction with the formation of passivation layer(s), such as thin $Si_3N_4$ and/or Se, between the metal and the semiconductor) of both the n-channel and the p-channel transistors, then it could be removed from the n-channel transistors, then the low workfunction metal associated with the n-channel transistors could be deposited in the source and drain regions of both the n-channel and p-channel transistors, also in possible conjunction with the formation of one or more passivation layer(s). The result would be both the high-workfunction metal and the low-workfunction metal in the source and drain regions of the p-channel transistors. However, with the high-workfunction metal at the interface, it would be that metal which determined the effective workfunction of the interface, and which acted as the source and drain proper of the p-channel transistors. The p-channel transistors would thus be exemplary of the present invention, while the n-channel transistors, in the absence of multiple metals in either the source or drain regions, would not be exemplary of the present invention, due to the absence of multilayer source(s) and/or drain(s).

Of course, it is also possible for separate metals to be used for the n-channel and p-channel transistors without either utilizing a multilayer metal, simply by removing at least one of the two metals from each transistor source and/or drain. Therefore, the use of a multilayer metal for the source(s) and/or drain(s) would be in conjunction with further motivation(s), such as those described previously, and/or process simplicity.

Similar to the preceding application, another motivation for multilayer source(s) and/or drain(s) may be to exploit multiple effective workfunctions within a single source or drain. For example, it may be beneficial, in an n-FET, to have a low effective workfunction at components of the metal/semiconductor interface in the direct vicinity of the channel, but a higher effective workfunction at the metal/semiconductor interface further from the channel. For example, this may exploit a reduced tendency of higher-workfunction metals to attract electrons, reducing the tendency of the source or drain to induce charge in the channel. In many applications, it is preferred to have the gate, rather than the source and/or drain, induce charge in the channel.

Some terms that have specific meaning in the context of the present invention are:

a. band gap: In a semiconductor, one of the following: (1) The difference in energy between the lowest energy states in the conduction band(s), and the highest energy states in the valence band(s), typically measured in "electron volts". (2) The potential difference between the lowest energy states in the conduction band(s), and the highest energy states in the valence band(s), typically measured in "volts". (3) The range of potentials and/or energies between those associated with the lowest energy states in the conduction band(s) and the highest energy state in the valence band(s).

b. channel tap: (synonymous with "source/drain", abbreviated "S/D") A conducting region which is the direct source or sink for carriers in a channel of a field-effect transistor. An example is an $n^+$source for an n-channel FET. Electrons from the source(s) are provided to the channel. One or more drains may serve as a sink for electrons from the channel. Another example is a metal source or drain of a metal source/drain p-FET, within which holes conduct from the metal, possibly tunneling through or emitting over an intermediate potential barrier, into the channel. However, a metal contact to the $n^+$source is not itself considered a "source", as it is not the direct supplier of carriers to the channel. Electrons are readily available from the $n^+$doped region that is the "source". Likewise, a metal contact to a doped drain is not itself the "drain". For a metal source or drain, only the metal region from which carriers for the channel are sourced or sunk is the source or drain of the transistor; metal in more remote contact with these regions are neither the "source" nor "drain". Transistor channels may require electrons (a conventional n-channel FET), holes (a conventional p-channel FET), either (an ambipolar FET), or the carriers may be generated by physical processes controlled by channel tap potentials (e.g., an impact ionization FET, see K. Gopalakrishnan, et al., *Impact ionization MOS (I-MOS)-Part I: device and circuit simulations*, IEEE Transactions Electron Devices, v. 52, no. 1, pp. 69-76 (2005)). In the last case, there may be no formal "source" consistent with this definition, although there may be one or more drains. See also "source" and "drain".

c. deposited source/drain: A channel tap in which the material forming the channel tap is deposited, such that the source consists essentially of the deposited material, as opposed to methods which form the channel tap from, or of, one or more semiconductors forming the semiconductor body.

d. drain: A channel tap primarily serving to remove carriers from the channel. See also "channel tap".

e. field-effect transistor (FET): A device that consists of one or more gates (conventionally one) that modulate the conductivity of one or more channels (conventionally one) to which two or more channel taps (conventionally two) are connected, where the gate(s) are essentially insulated from the channel(s). In an n-channel FET, the channel(s) consist primarily of electrons. In a p-channel FET, the channel(s) consist primarily of holes. In an ambipolar FET, the channel(s) can be either electrons or holes.

f. insulated gate field effect transistor (IGFET): a FET in which the gate is relatively insulated from the channel, for example where the current from the gate is less than 0.1% the current in the channel, when transistor terminals are biased in a fashion typically designated to maximize the channel current consistent with normal operation.

g. metal source/drain: a channel tap in which the source and/or sink of carriers from the channel is primarily a metal. More specifically, a channel tap where rectification between the region of the channel and the metal contact is determined primarily by the metal workfunction relative to the potentials of the semiconductor conduction band and/or valence band. If the workfunction is less than the semiconductor electron affinity, or much less than half the semiconductor band gap greater than the electron affinity, electrons are relatively passed and holes are relatively blocked by the contact, and the contact will be typically suitable for use in an n-channel FET. If the workfunction is much more than half a semiconductor band gap greater than the semiconductor electron affinity, holes will be generally passed by the contact more readily than electrons, and the contact will be typically suitable for use in p-channel FETs.

h. multilayer metal source/drain: a metal channel tap wherein the metal serving as the source and/or sink of carriers is essentially fully capped, in the vicinity of the channel tap, by one or more different metal(s). In other words, surfaces exposed in a first metal, following the deposition of the first metal, are subsequently covered or mostly covered by the deposition of one or more subsequent metal(s). The first metal, in preferred embodiments, may be as thin as only several monolayers such that it serves as the source or drain of carriers for the channel.

i. self-aligned: a process is "self-aligned" if one or more regions or boundaries resulting from the process has an orientation or position, relative to one or more other regions or boundaries, which is a natural consequence of the process, not involving the explicit positioning or orienting of masks or other pattern transfer mechanisms. For example, if a material is deposited in a recess, then etched to a level such that it remains only in the recess, the process is self-aligned to the edge of the recess or to regions or boundaries naturally aligned to the edge of the recess. Furthermore, a process in which a material, by virtue of chemistry or other means, is deposited in a recess, yet not in the region surrounding the recess, is self-aligned to the edges of the recess. On the other hand, if, following the formation of the material in both the recess and in the region surrounding the recess, a separate material is patterned via the manual alignment of a mask to one or more edges of the recess, and that second material is used to transfer a pattern to the first material which, depending on the success of the alignment, may be aligned or not aligned to the recess edge, then the process of patterning the first material is not "self-aligned".

j. source: A channel tap primarily serving to provide carriers to the channel. See also "channel tap".

In one embodiment, the present invention provides a process in which a metal source and/or drain is deposited, possibly in conjunction with the formation of one or more passivation layers, possibly selectively on semiconductor regions. The passivation layer(s) may be deposited, grown, or formed via other means. Optionally, the metal layer is planarized to remove certain portions in a self-aligned fashion. Also optionally, the metal layer is patterned and etched, to remove certain portions, for example from devices for which it is not to serve as a source and/or drain, or for example from a subset of the source(s) and drain(s) in a device. This patterning process may involve the deposition and subsequent removal of certain materials, such as photoresist and/or a "hard mask" of another material. The photoresist and/or hard mask materials would then be fully removed, at least from transistor source and/or drain regions processed in accordance to the present invention. A second metal is then deposited, at least on exposed surfaces of the first metal, but optionally on additional surfaces, and optionally in conjunction with the formation of one or more passivation layers.

Subsequent processing is unrestricted, as long as in the final device there exist source(s) and/or drain(s) comprising the first metal, or an alloy of or reaction product of the first and/or the second metal and/or one or more additional metal(s), in contact with one or more semiconductors in the vicinity of a channel region, essentially covered by the second metal, or an alloy or reaction product of the first and/or second metal and/or one or more additional metal(s). In some cases, at these source(s) and/or drain(s), the effective workfunction associated with the metal/semiconductor interface is essentially affected by the first metal, but not the second metal. In other cases, alloying and/or chemical reaction may cause the second metal to affect the composition of the metal at the interface, and/or the phase of the metal at the interface, and therefore the second metal would affect the effective workfunction at the interface. In either case, some metal at the semiconductor interface, and some metal further from the semiconductor interface, must maintain distinguishable characteristics, such that the source(s) and/or drain(s) are multilevel metal source(s) and/or drain(s). For example, they are not each of the same chemical composition and phase, and neither has been fully converted into a non-metallic state.

A principal difference between this invention and the prior art is the use of a potentially relatively thin (for example, no greater than 100 nm thick, perhaps as thin as a few monolayers) metal deposited as a source and/or drain of a semiconductor-based field-effect transistor, fully or almost fully capped with a second deposited metal, possibly in conjunction with the deposition of other metal(s) and/or the formation of passivation layer(s). The first metal may be in direct contact with the semiconductor, or separated from the semiconductor by one or more passivation layers, such that the source of electrons or holes for the channel is the first metal. The first metal and the subsequent metal(s) should be distinct, but may share common alloyed and/or compounded elements; the chemical composition and/or phase of the metals may differ from their composition and/or phase immediately following their deposition or formation. The interface between the two metals may be abrupt, or it may be gradual. For example, there may be alloying at the interface between the two materials. The alloying may even extend to the metal/semiconductor interface, as long as the alloy at the interface has qualities that distinguish it from the metal further from the interface.

A principal insight of the invention is that the behavior of the interface is determined by the metal at the interface, and thus the metal further from the interface, even if separated from the interface by only a few interatomic spacings, can have different characteristics from the metal at the interface. These differing characteristics may make the multilayer structure superior to a similar net thickness of the first metal alone, for example due to the aforementioned chemical stability, electrical resistivity, thermal resistivity, or suitability for other devices integrated in the same fabrication process. Additionally, the differing characteristics may make the multilayer structure superior to a similar net thickness of the second and/or subsequent metal(s) without the first metal, for example due to the effective workfunction at the interface with the semiconductor comprising the channel region.

Importantly, in embodiments of the present invention, the metal source(s) and/or drain(s) are deposited. One motivation for the present invention is the issue of chemical stability with metals which may be preferred candidate source and/or drain metals. For example, the following candidate materials each may exhibit a tendency to react with one or more adjacent materials, or with one or more gases encountered during processing or device operation: Mg, Rb, Cs, La, Ce, Pr, Nd, Pm, Sm, Eu, Gd, Tb, Dy, Ho, Er, Tm, Yb, or alloys consisting primarily of one or more of the preceding elements. Silicides of these metals, wherein silicides are perhaps presently the standard class of materials employed as metal sources and drains in silicon-based FET technology, tend to have greater chemical stability than these metals in their unreacted forms, but also may tend to have workfunctions greater than those of these metals, thus perhaps making them less attractive for achieving low barrier heights for electrons than the same metals in their unreacted forms, for example for source(s) and/or drain(s) of n-channel FETs. Similarly, silicides of high workfunction metals such as Pt and Ir are considered to have lower workfunctions than these metals in their unreacted forms, perhaps making them less attractive for source(s) and/or drain(s) of p-channel FETs.

Some examples of source/drains that are not deposited include implanted source/drains, out-diffused source/drains, and chemically reacted source/drains. Implanted source/drains are created by the exposure of a semiconductor surface, in the vicinity of a source or drain, to energetic ions, wherein some fraction of those ions which are incorporated into the semiconductor, possibly following further processing, alter the charge state of the semiconductor to convert it to a relatively conducting state. In this case, although the impingement of ions toward the semiconductor surface might be considered a form of "deposition", the source or drain itself is not deposited, as the electrons and/or holes are provided to, or drained from, one or more associated channels, by or to the semiconductor, rather than a deposited material.

Out-diffused sources or drains may be generated by depositing one or more materials onto a semiconductor surface in the vicinity of the source or drain. Possibly with the application of heat, impurities are extracted from the deposited material into the semiconductor, causing it to become highly conducting. The deposited material then may be removed, leaving behind the impurities that have been incorporated into the semiconductor. This approach, even though it involves the deposition of a material responsible for the formation of the source or drain, is not however a deposited source or drain, as the electrons and/or holes are provided to, or drained from, one or more associated channels, by or to the semiconductor, rather than a deposited material, similar to the case of the implanted source/drain.

A chemically reacted source/drain, such as a silicide, involves the reaction with a semiconductor in the vicinity of a source or drain with another, possibly deposited, material, possibly a metal. However, the deposited material is not itself a source or drain. Indeed, it is the usual practice in the art of silicide source/drains to remove any unreacted portion of the deposited metal following the chemical reaction forming the silicide.

A deposited source or drain in the context of the preset invention may involve a chemical reaction, or alloying, as long as each of the constituent materials was deposited. For example, an alloy of metals X and Y ("X" and "Y" being symbolic for the metals, rather than representing any particular elements), may be deposited via the sequential deposition of X and Y. Perhaps due to the application of heat, an alloy may be subsequently formed from the metals X and Y. This alloying process may occur during the deposition of Y, immediately following the deposition of Y, or well later in the process. For the purposes of the present invention, the process of depositing metals X and Y, optionally including one or more steps to cause alloying and/or chemical reaction between X and Y, is considered the "deposition" of a metal, for example an alloy $X_xY_{1-x}$ for some atomic fraction x.

Figure 2A:
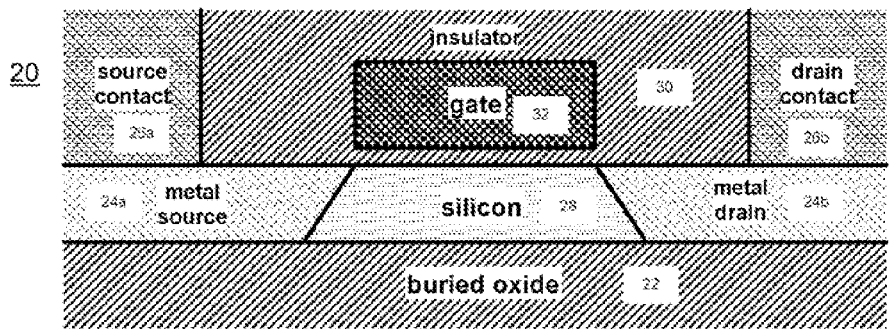
FIGS. 2(a), 2(b) and 2(c) present examples of transistors that include multilayer metal structures, however, only the device illustrated in FIG. 2(b) includes a multilayer, deposited source/drain in accordance with embodiments of the present invention.

FIG. 2(a) illustrates an example of a single metal source/drain transistor 20, formed on thin "silicon on insulator" (SOI) substrate 22. Although transistor 20 includes deposited source/drain 24a and 24b, and metal source/drain contacts 26a and 26b, the second metal is a contact to the first metal, and is not a component of a multi-layer metal source/drain. That is, during fabrication the source/drain metal was deposited and planarized, forming source/drain 24a and 24b adjacent to silicon channel 28, and an insulator 30 was used to cover same. Thereafter, contact holes were etched into insulator 30 to expose a portion of the first metal, and the second metal (for contacts 26a and 26b) was deposited in the contact holes. A gate 32 is also present in the structure. In this example, the source and drain effectively consist of a single metal; the contacts are not part of a multi-layer source/drain as contemplated in this invention, but are instead auxiliary structures.

Figure 2B:
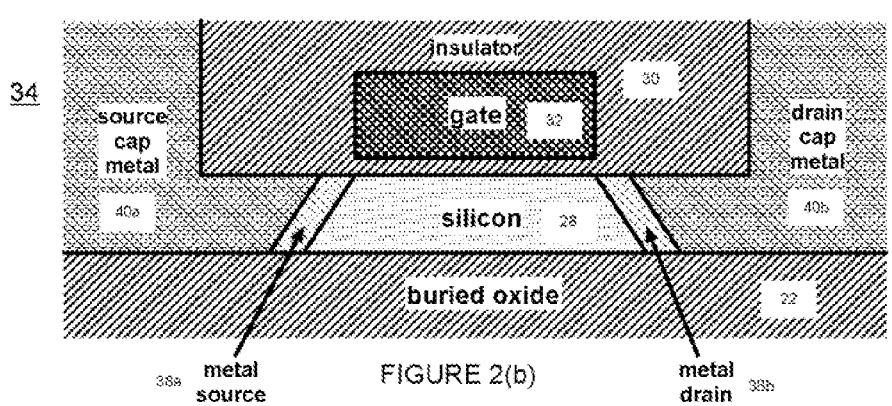

FIG. 2(b) illustrates a device 34 fabricated in accordance with an embodiment of the present invention. Here, a thin layer of a first metal was deposited selectively on exposed Si to form source/drain 38a, 38b. Thereafter, but prior to the deposition or growth of any other layer, a second metal was deposited as a cap. This results in source cap 40a and drain cap 40b being formed. The same metal may subsequently be used as a contact, although this is not critical to the present invention. The present process forms a multi-layer metal in the source/drain regions, wherein the effective workfunction of the interface is determined primarily by the first metal.

Figure 2C:
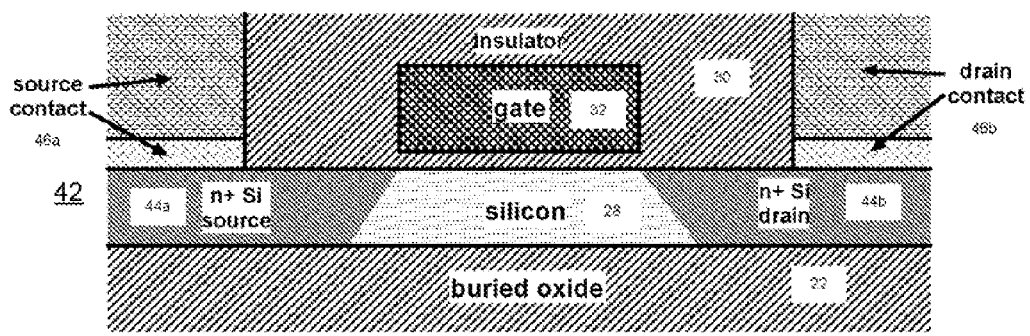

FIG. 2(c) presents an example of a device 42 having source/drain regions 44a, 44b that are doped semiconductor, rather than metal. Although there is a multi-layer metal structure present (i.e., source/drain contacts 46a and 46b), the metal forms neither source nor drain of the transistor, the source and drain instead formed in heavily doped n-type silicon ($n^+Si$).

Referring now to FIGS. 3(a)-3(f), various examples of device structures are illustrated. Each of these examples is of a Si-based transistor on an insulating substrate (SOI). However, the present invention is in no way limited to such an example. For example, the methods of the present invention also apply to fully semiconducting "bulk" substrates. Furthermore, the semiconductor need not be Si. Other semiconductors relevant to the present invention include Ge, $Ge_xSi_{1-x}$ alloys, $Si_xC_{1-x}$ alloys, $Ge_xSi_yC_{1-x-y}$ alloys, $Ge_xCl_{1-x}$ alloys, diamond C, and molecular C semiconductors. Further semiconductors include "III-V" compounds such as GaAs, II-VI compounds such as ZnSe, and III-VI compounds such as GaSe. Essentially, the form of the semiconductor is not critical to the present invention. Furthermore, each of these transistors is shown with a single source, a single gate, and a single channel. However, this is not at all limiting of the scope of the present invention. There can be multiple sources, multiple drains, multiple gates, and/or multiple channels. For example, multi-gate devices have two more gates, and may have two or more channels. The key is that the field-effect transistor has a semiconducting body in conjunction with one or more metal source(s) and/or drain(s).

Figure 3A:
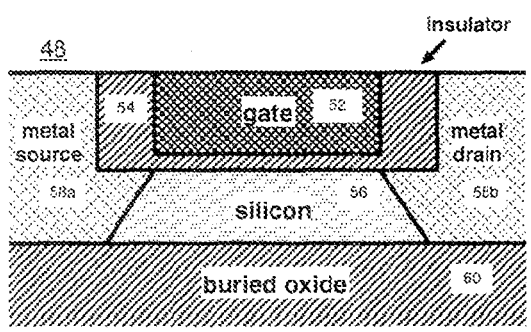
FIGS. 3(a)-3(f) illustrate examples of metal source/drain transistors designs. In particular.

In FIG. 3(a), a reference case of a single metal source/drain transistor 48 is shown. While not an example of the present invention, this reference structure demonstrates some features common to all of the transistors 50, 50', 50", 50''' and 50'''' shown in FIGS. 3(b)-3(f), respectively. The structure can be formed using methods well known in the art to form the gate 52 and surrounding insulators 54. To recess the source and drain below the plane of the channel, the silicon 56 may then be etched to expose the silicon geometry shown in the illustrations. Following this, the source/drain 58a/58b metal can be deposited, possibly in conjunction with the formation of one or more passivation layer(s) at the interface. A planarization technique, such as chemo-mechanical polishing, may then be used to restrict the metal to the region below the top of the gate stack. The substrate may include a buried oxide layer 60. Many details of a full process are omitted from this description. For an example of more detailed descriptions of methods for forming deposited source/drain transistors, see, for example, Grupp, et al., U.S. patent application Ser. No. 11/166,286, "Process for Fabricating a Self-Aligned Deposited Source/Drain Insulated Gate Field-Effect Transistor", filed 23 Jun. 2005.

Examples of devices that could be fabricated using processes as disclosed in the present invention are shown in FIGS. 3(b)-3(f). The device 50 shown in FIG. 3(b) includes a layered source/drain. The first metal, forming the source and drain 58a and 58b proper, establishes the effective workfunction of the interface. In the example, it is assumed the first metal was deposited on all available surfaces, of a sufficiently limited thickness to leave room for the cap metal 62 below the top plane of the gate 52, wherein the metal stack is subsequently planarized to the top plane of the gate.

Figure 3D:
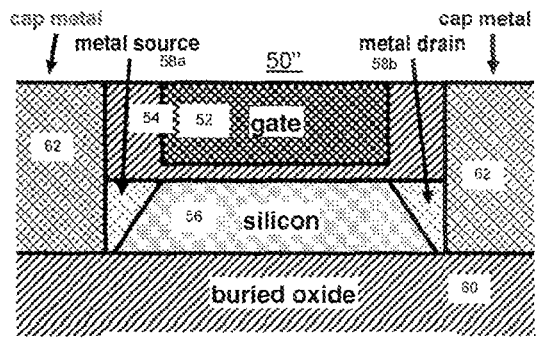
Figure 3B:
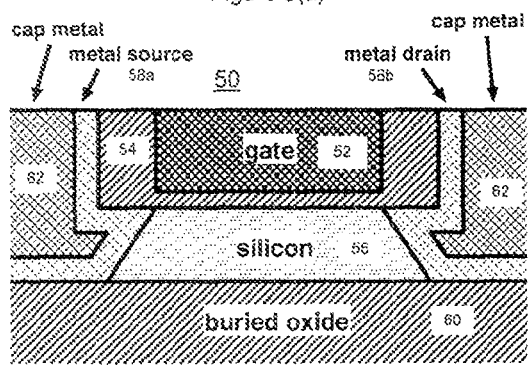
Figure 3E:
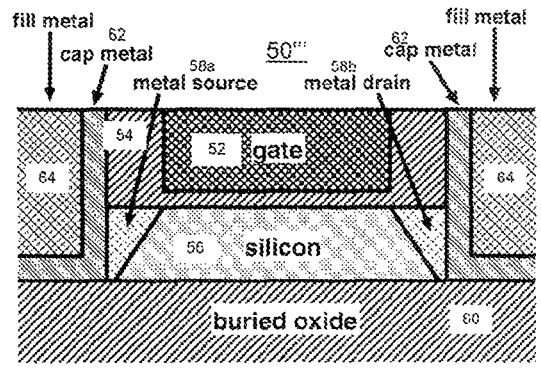
Figure 3C:
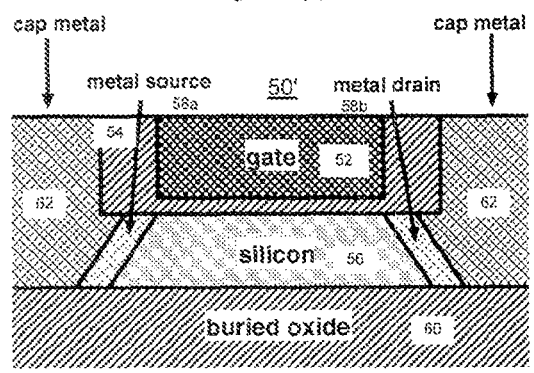

FIG. 3(c) illustrates an alternate approach. Here in device 50', the first metal is assumed to be selectively deposited on the exposed Si 56, again to limited thickness, prior to the deposition of a thick cap metal 62, which is subsequently planarized.

In FIG. 3(d), a third approach is illustrated. Here in device 50", the first metal is assumed to have been deposited, possibly selectively or non-selectively. Then, it was assumed to have been etched from the region not protected by the overhang of the insulator 54. The cap metal 62 was then assumed to have been deposited and subsequently planarized, as in the preceding two examples.

The example shown in FIG. 3(e) illustrates a close derivative of the immediately preceding approach. Here, in device 50''', a thinner cap metal 62 is deposited, followed by a "fill metal" 64, prior to planarization. The fill metal 64 may have reduced electrical resistance, for example, relative to the cap metal 62, while lacking the chemical stability with the source/drain metal 58a /58b at the interface.

Figure 3F:
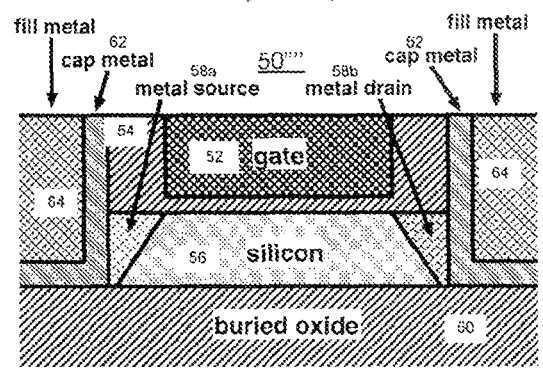

FIG. 3(f) illustrates an asymmetric device 50''''. The difference from the preceding example is that separate metals 58a and 58b are used for the source and drain. Such a device may be a "tunneling n-channel transistor" in which the source metal is high workfunction, and the drain metal is low workfunction (i.e., an asymmetrical Schottky-barrier MOSFET; see, e.g., Y. Zhang, et al., "*Design of 10-nm-Scale Recessed Asymmetric Schottky Barrier MOSFETs*", IEEE EDL, v. 23, n. 7, pp. 419-421 (July 2002)).

Figure 4A:
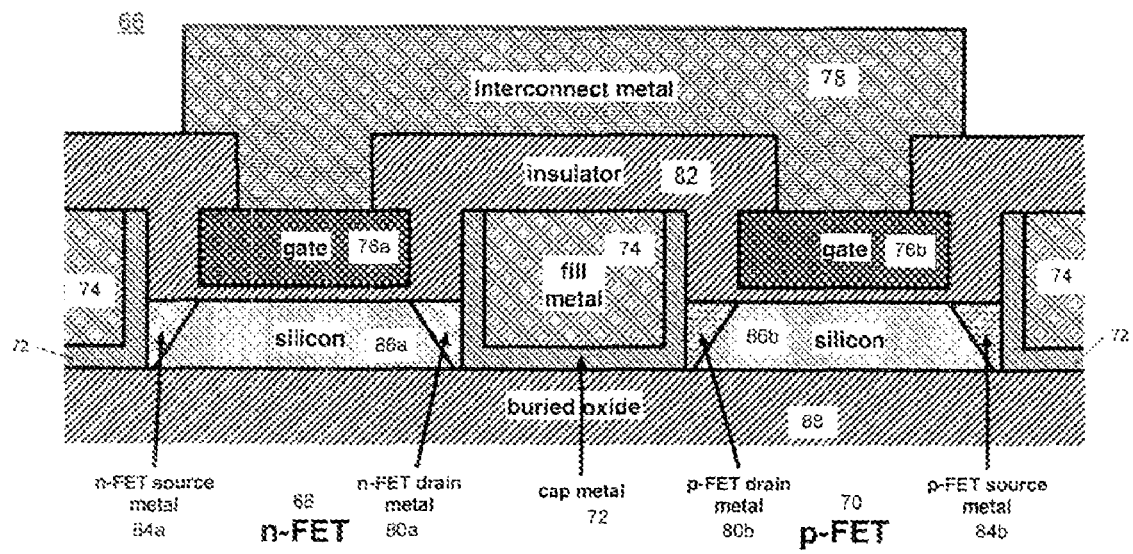
FIGS. 4(a) and 4(b) illustrate examples of CMOS devices fabricated in accordance with embodiments of the present invention.

An example of a device 66 fabricated in accordance with the present invention and using a CMOS process is shown in FIG. 4(a.) This device illustrates an example of a tri-layer metal, where the interfacial metal determines the device type. A low-workfunction metal, for example, is used for the n-channel FET (n-FET) 68, while a high-workfunction metal, for example, is used for the p-channel FET (p-FET) 70. Since the workfunction of the cap and of the fill metals 72, 74, respectively, are non-critical to the behavior of the source and drain, the two device types share the same cap and fill metals. In the illustration, the devices 68 and 70 are connected in an inverter configuration. The gates 76a and 76b are connected with a metal interconnect 78. The drains 80a and 80b are connected through common cap and fill metals covered by an insulator 82. Each device also includes a respective source 84a, 84b and a semiconductor (in this case silicon) channel 86a, 86b. The substrate may include a buried oxide layer 88.

Figure 4B:
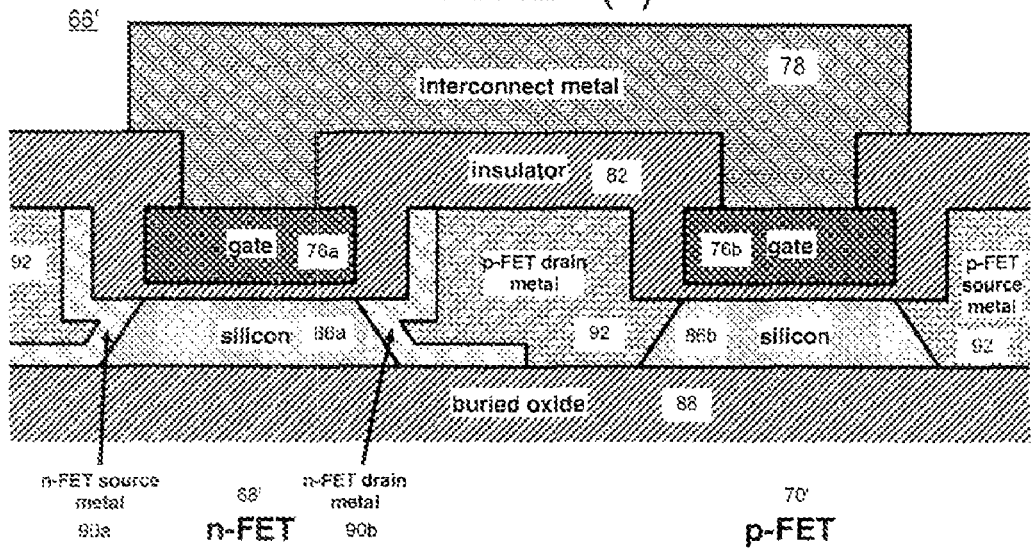

An alternate CMOS example is illustrated in FIG. 4(b). Here, the device 66' includes n-FET 68' and p-FET 70'. A thin, low-workfunction metal was deposited and patterned, such that it remained only in the vicinity of n-channel FET source/drains 90a /90b. The metal for the p-FET source/drains 92 was then globally deposited. The metal stack was then planarized to confine it to the source/drain regions. This left a multilayer source/drain metal in the n-FET source and drain regions, with a single-level source/drain metal in the p-FET source and drain regions. Thus, although only the n-FET possesses a multilevel metal, the complementary process is an embodiment of the present invention. Many other CMOS configurations are possible; these examples are provided only as illustrations.

Figure 5A:
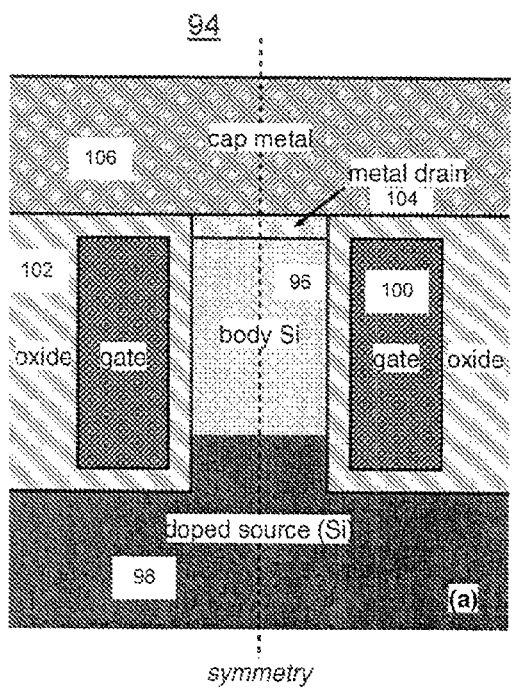
FIG. 5(a) illustrates an example of vertically oriented metal-drain FET, fabricated in accordance with embodiments of the present invention.

FIG. 5(a) illustrates a further example of a device fabricated in accordance with embodiments of the present invention, in this case a metal drain pillar FET 94 or (yielding an equivalent cross-section) a vertical transistor metal drain FET formed from a fine. For the purposes of the following discussion, it will be assumed the transistor is a pillar, with axial symmetry about the indicated axis. In the case of a fin-based geometry, the symmetry is left-right reflection symmetry about the indicated line (which constitutes a plane in three dimensions). This specific example shows a transistor formed with a lightly doped pillar 96 upon a heavily doped substrate 98, wherein the penetration of doping into the pillar forms the transistor source. The pillar is surrounded with a gate 100 (a single gate for a pillar, potentially two gates for a fin geometry). The top of the pillar is recessed below the surrounding oxide 102. Metal for the drain 104 was deposited within the recess, either selectively on the silicon, or globally. In the case of global deposition, the metal could then be confined to the recess (yielding a structure consistent with the schematic), or left on the oxide. Optionally, one or more passivation layer(s) may also have been formed in conjunction with the drain metal deposition. The cap metal 106 was then deposited on the drain metal, as well as on the surrounding oxide, allowing interconnection between the transistor drain and other circuit elements.

Figure 5B:
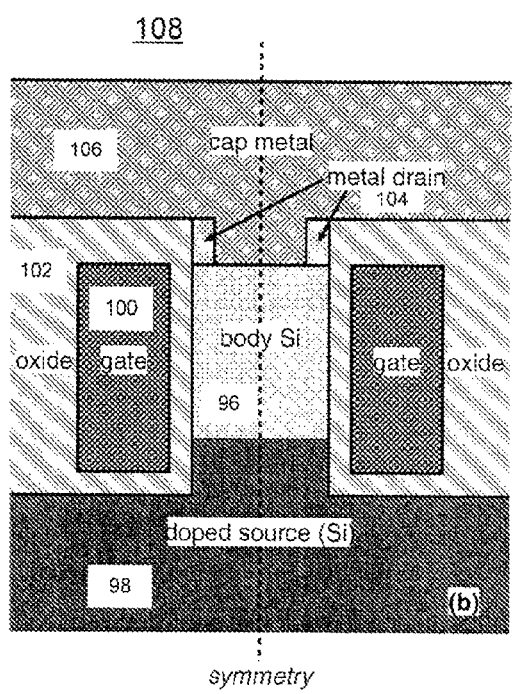
FIG. 5(b) illustrates a similar device to that shown in FIG. 5(a), except the drain was formed with a spacer, and thus covers only a fraction of the metal/semiconductor interface.

FIG. 5(b) shows a similar device 108. However, here the drain metal 104 contacts only a fraction of the metal/semiconductor interface. The drain may be formed using a spacer technique, of which there are numerous examples well-known in the art. The drain is still a multilayer drain, however, and thus is an example processed in accordance with the present invention.

One motivation for a design such as is shown in FIG. 5(b) includes reducing drain-to-channel coupling, relative to a design in which the entire Si/metal interface comprises a single metal. For this purpose, the interface between the cap metal and the Si should have a higher (if this is an n-FET) effective workfunction than the interface between the drain metal and the Si.

Thus, in accordance with embodiments of the present invention, a semiconductor-based FET, includes one or more multi-layer deposited metal source(s) and/or drain(s), formed following the exposure of a possibly passivated semiconductor surface for the appropriate source(s) and/or drain(s). The source(s) and/or drain(s) are deposited or formed from a first metal layer, possibly in conjunction with the formation of one or more passivation layer(s). Next, a second metal layer is deposited or formed, possibly in conjunction with the formation of one or more passivation layer(s). Each or either of these steps optionally includes patterning, etching, the application of heat, and/or exposure to one or more gases and/or other chemicals. Patterning may include the deposition of one or more layers, such that these one or more layers do not themselves inhibit the flow of current between the adjacent layers, in one or more of the completed source(s) and/or drain(s).

Preferably, the second metal exhibits superior chemical stability with one or more materials with which it is in contact, relative to the chemical stability of the first metal with the same materials. Further, the area of contact between the second metal and these materials is preferably greater than the area of contact between the first metal and these materials. In some cases, the second metal possesses a lower electrical resistivity and/or a lower thermal resistivity than the first metal.

In some embodiments of the invention, the first metal has, in its bulk form, a melting point of no greater than 100° C., or the maximum anticipated operating temperature of the device plus 50° C., whichever is greater. Also, in some cases the first metal has a thickness no greater than 3 atomic layers, or 2 nm, whichever is thinner. The first metal capped with the second metal is preferably stable to at least 20° C. greater than the melting point of the first metal in its bulk form.

In various embodiments of the invention, the first metal layer, at the time of the deposition of the second metal layer, has a thickness of no more than approximately 100 nm, or of no more than approximately 10 nm. Alternatively, or in addition, the first metal layer may be formed and/or deposited with a thickness of no less than 3 atomic layers, or 1 nm, whichever is thinner.

The second metal may be deposited at a partial pressure of oxygen less than 0.001 standard atmospheres, and the first metal also deposited at a partial pressure of oxygen of no more than 0.001 standard atmospheres, and the overall device not exposed to a partial pressure of more than 0.001 standard atmospheres between the deposition of the first metal and the deposition of the second metal.

In embodiments of the invention, a semiconductor forming the region of the channel in the vicinity of the source(s) and/or drain(s) may consist primarily of Si, Ge, and/or an alloy of Si and Ge. Alternatively, the semiconductor forming the region of the channel in the vicinity of the source(s) and/or drain(s) may consist primarily of Si, Ge, C, an alloy of Si and Ge, an alloy of Si and C, an alloy of Ge and C, or an alloy of Si, Ge, and C. Still further, in embodiments of the invention the semiconductor forming the region of the channel in the vicinity of the source(s) and/or drain(s) may consist primarily of an alloy or compound of column III and column V elements on the periodic table, an alloy or compound of column II and column VI elements on the periodic table, or an alloy or compound of column II, III, IV, V, and/or column VI elements on the periodic table. In some cases, the semiconductor forming the region of the channel in the vicinity of the source(s) and/or drain(s) may consist primarily of a molecular semiconductor, primarily of carbon.

In some instances, at the end of the fabrication of the device, at one or more source(s) and/or drain(s), the metal at the interface with the semiconductor in the vicinity of the region of the channel will have a distinctive character from some metal further from the interface which was deposited in the same sequence described above.

In embodiments of the invention, the first metal is etched in a self-aligned fashion prior to the deposition of the second metal. Also, the first metal may be patterned and etched prior to the deposition of the second metal. In either instance, the first metal may be deposited selectively, such that it is deposited only on exposed semiconductor surfaces, or on passivation layers on semiconductor surfaces.

In some instances, there may exist contiguous interfaces between the first metal and semiconductor, and between the second metal and semiconductor, with either an abrupt or a gradual transition, wherein the metal at an interface in a gradual transition is a range of alloys each comprising components of both metals. Either or both of the first and/or second metals may be deposited in conjunction with the formation of one or more passivation layers. Also, the two metals may be alloyed or reacted subsequent to the deposition of the second metal, such that not all of the second metal is fully reacted or alloyed.

The first metal may have a bulk workfunction less than the electron affinity of a semiconductor in the vicinity of the metal/semiconductor interface, wherein this interface may or may not contain one or more passivation layer(s). For example, the first metal may be primarily one of Mg, Rb, Cs, La, Ce, Pr, Nd, Pm, Sm, Eu, Gd, Tb, Dy, Ho, Er, Tm, Yb, or Lu; or primarily Rb or Cs; an alloy of any of the foregoing; a compound of one or more of the foregoing; a hexaboride of any of the foregoing (or an alloy of such a hexaboride). Likewise, the second metal may be any of the above.

The first metal may have a bulk workfunction in excess of the ionization potential of one or more semiconductors in the vicinity of the metal/semiconductor interface, wherein this interface may contain one or more passivation layer(s). for example, the first metal may be primarily Pt or Ir, an alloy of Pt and/or Ir, or a compound of Pt and/or Ir.

In some instances, one of the metals may have a workfunction less than the electron affinity of some semiconductor in its vicinity, while the other metal has a workfunction greater than the ionization potential of some semiconductor in its vicinity.

In accordance with various embodiments of the invention, a semiconductor-based FET having one or more multi-layer deposited metal source(s) and/or drain(s) consisting of at least three layers of metal is provided. These source(s) and/or drain(s) may be formed, subsequent to the exposure of a possibly passivated semiconductor surface for the appropriate source(s) and/or drain(s), by depositing or forming a first metal layer, possibly in conjunction with the formation of one or more passivation layer(s); then depositing or forming a second metal layer, possibly in conjunction with the formation of one or more passivation layer(s), prior to the deposition or formation of additional non-metallic layers; and then depositing or forming a third metal layer, possibly in conjunction with the formation of one or more passivation layer(s), prior to the deposition or formation of additional non-metallic layers.

Each of the "deposition" steps optionally includes patterning, etching, the application of heat, and/or exposure to one or more gases and/or other chemicals, wherein patterning may include the deposition of one or more layers, such that these one more layers do not themselves inhibit the flow of current between the adjacent layers, in one or more of the completed source(s) and/or drain(s).

Preferably, the second metal and/or one or more of its passivation layers exhibits superior chemical stability with the first metal than does the third metal and/or one or more of its passivation layers with the first metal. Further, the third metal preferably exhibits superior chemical stability with one or more materials with which it is in contact, relative to the chemical stability of the second metal with the same materials, and the area of contact between the third metal and these materials is preferably greater than the area of contact between the second metal and these materials. The third metal may possess a lower electrical resistivity and/or lower thermal resistivity than does the second metal.

Either the first or the second metal may have a workfunction less than the electron affinity of some semiconductor in its vicinity, and the other of the first and the second metal may have a workfunction greater than the ionization potential of some semiconductor in its vicinity. Also, either the first or the third metal may have a workfunction less than the electron affinity of some semiconductor in its vicinity, and the other of the first and the third metal may have a workfunction greater than the ionization potential of some semiconductor in its vicinity.

What is claimed is:

1. A method, comprising:

following exposure of a first semiconductor surface for a first metal source and/or drain of a first field-effect transistor (FET), and a second semiconductor surface for a second metal source and/or drain of a second FET, creating a first metal layer for the first metal source and/or drain, the first metal layer having (i) a work function less than an electron affinity of a semiconductor proximate to an interface between the first metal layer and a semiconductor comprising a channel of the first FET, and (ii) a thickness of at least 1 nm but no more than 100 nm; and creating a second metal layer for the second metal source and/or drain and capping the first metal layer with a thickness of no less than 1 nm, the second metal layer having a work function greater than an ionization potential of a semiconductor comprising a channel of the second FET.

2. The method of claim 1, wherein the first metal layer is deposited with a thickness of at least 1 nm but no more than 100 nm, and consists primarily of at least one or more of: Mg, Rb, Cs, La, Ce, Pr, Nd, Pm, Sm, Eu, Gd, Tb, Dy, Ho, Er, Tm, Yb, Lu, Rb, and Cs and a compound or alloy including two or more of Mg, Rb, Cs, La, Ce, Pr, Nd, Pm, Sm, Eu, Gd, Tb, Dy, Ho, Er, Tm, Yb, Lu, Rb, and Cs; and the second metal layer includes at least one of Pt, Ir, a compound including Pt, and a compound including Ir, a mixture including Pt, Ir, a compound including Pt, and a compound including Ir, a compound including Pt, Ir, a compound including Pt, and a compound including Ir, and an alloy including Pt, Ir, a compound including Pt, and a compound including Ir.

* * * * *